United States Patent
Oyama et al.

(10) Patent No.: US 12,241,782 B2
(45) Date of Patent: **\*Mar. 4, 2025**

(54) TRANSPORTATION METHOD

(71) Applicant: HAMAMATSU PHOTONICS K.K., Hamamatsu (JP)

(72) Inventors: Hiroki Oyama, Hamamatsu (JP); Katsumi Shibayama, Hamamatsu (JP); Takashi Kasahara, Hamamatsu (JP); Masaki Hirose, Hamamatsu (JP); Toshimitsu Kawai, Hamamatsu (JP); Yumi Kuramoto, Hamamatsu (JP)

(73) Assignee: HAMAMATSU PHOTONICS K.K., Hamamatsu (JP)

( \* ) Notice: Subject to any disclaimer, the term of this patent is extended or adjusted under 35 U.S.C. 154(b) by 0 days.

This patent is subject to a terminal disclaimer.

(21) Appl. No.: 18/083,074

(22) Filed: Dec. 16, 2022

(65) Prior Publication Data

US 2023/0118479 A1    Apr. 20, 2023

Related U.S. Application Data

(63) Continuation of application No. 16/765,765, filed as application No. PCT/JP2018/041729 on Nov. 9, 2018, now Pat. No. 11,592,332.

(30) Foreign Application Priority Data

Nov. 24, 2017    (JP) ................................. 2017-225973

(51) Int. Cl.
*H01L 21/67*    (2006.01)
*B65D 85/48*    (2006.01)
(Continued)

(52) U.S. Cl.
CPC ................ *G01J 3/26* (2013.01); *B65D 85/48* (2013.01); *G02B 26/00* (2013.01); *G02B 26/02* (2013.01);
(Continued)

(58) Field of Classification Search
CPC ........... G01J 3/26; B65D 85/48; G02B 26/00; G02B 26/02; G02B 5/284; G02B 26/0841;
(Continued)

(56) References Cited

U.S. PATENT DOCUMENTS 9,377,357 B2 \*    6/2016    Matshushita ............... G01J 3/10
9,588,333 B2 \*    3/2017    Sano ......................... G01J 3/26
(Continued)

FOREIGN PATENT DOCUMENTS

CN    1671617 A    9/2005
CN    105992964 A    10/2016
(Continued)

OTHER PUBLICATIONS

International Preliminary Report on Patentability mailed Jun. 4, 2020 for PCT/JP2018/041729.
(Continued)

*Primary Examiner* — Mohammed Shamsuzzaman
(74) *Attorney, Agent, or Firm* — Faegre Drinker Biddle & Reath LLP

(57) ABSTRACT

A transportation method for transporting an object including a plurality of Fabry-Perot interference filters, the transportation method including a first step of accommodating the object in an accommodating container, wherein the Fabry-Perot interference filter includes a substrate, a first mirror portion and a second mirror portion provided on the substrate to face each other via a gap and in which a distance from each other is variable, and in the first step, the object is accommodated and supported in the accommodating (Continued)

container in a state where the plurality of Fabry-Perot interference filters is two-dimensionally arranged.

9 Claims, 10 Drawing Sheets

(51) Int. Cl.
    *G01J 3/26*     (2006.01)
    *G02B 26/00*     (2006.01)
    *G02B 26/02*     (2006.01)
    *H01L 21/673*     (2006.01)
    *H01L 21/677*     (2006.01)

(52) U.S. Cl.
    CPC ...... *H01L 21/673* (2013.01); *H01L 21/67359* (2013.01); *H01L 21/677* (2013.01)

(58) Field of Classification Search
    CPC ............... G02B 26/001; H01L 21/673; H01L 21/67359; H01L 21/677; H01L 21/67383; H01L 21/67376
    See application file for complete search history.

(56) References Cited

U.S. PATENT DOCUMENTS

| | | |
|---|---|---|
| 2010/0238454 A1 | 9/2010 | Pruessner et al. |
| 2011/0252636 A1 | 10/2011 | Kitahara et al. |
| 2015/0294932 A1 | 10/2015 | Noh et al. |

FOREIGN PATENT DOCUMENTS

| | | | | |
|---|---|---|---|---|
| EP | 3106910 A1 | | 12/2016 | |
| JP | H11-130250 A | | 5/1999 | |
| JP | 2002-164280 A | | 6/2002 | |
| JP | 2004131143 A | * | 4/2004 | ............... G01J 3/26 |
| JP | 2005-235872 A | | 9/2005 | |
| JP | 2008-135727 A | | 6/2008 | |
| JP | 2009-043862 A | | 2/2009 | |
| JP | 2010-160033 A | | 7/2010 | |
| JP | 2011227172 A | * | 11/2011 | ............... G01J 3/26 |
| JP | 2012-068059 A | | 4/2012 | |
| JP | 2012-128136 A | | 7/2012 | |
| JP | 2013-030703 A | | 2/2013 | |
| JP | 2013-506154 A | | 2/2013 | |
| JP | 2013-157395 A | | 8/2013 | |
| JP | 2013-201248 A | | 10/2013 | |
| JP | 2014-026994 A | | 2/2014 | |
| JP | 2014222747 A | * | 11/2014 | ............... G01J 3/26 |
| JP | 2015-082588 A | | 4/2015 | |
| JP | 2015-135881 A | | 7/2015 | |
| JP | 2015-152713 A | | 8/2015 | |
| JP | 2016-099583 A | | 5/2016 | |
| TW | 201601238 A | | 1/2016 | |
| WO | WO-2007/066384 A1 | | 6/2007 | |
| WO | WO 2011/036346 A1 | | 3/2011 | |

OTHER PUBLICATIONS

Norbert Neumann et al, "Tunable infrared detector with integrated micromachined Fabry-Perot filter", Journal of Microlithography, Microfabrication and Microsystems, Society of Photo-Optical Instrumentation Engineers, Belingham, US, vol. 7, No. 2, Apr. 1, 2008, p. 21004-1, XP007922298.

* cited by examiner

TRANSPORTATION METHOD

CROSS-REFERENCE TO RELATED APPLICATIONS

This application is a continuation application of U.S. application Ser. No. 16/765,765, filed on May 20, 2020, which is a National Stage Entry of PCT/JP2018/041729, filed on Nov. 9, 2018, which claims the benefit of priority to Japanese Patent Application No. 2017-225973, filed on Nov. 24, 2017, the entire contents of which are incorporated herein by reference.

TECHNICAL FIELD

One aspect of the present invention relates to a transportation method.

BACKGROUND ART

In the related art, a Fabry-Perot interference filter including a substrate, a fixed mirror and a movable mirror facing each other via a gap on the substrate is known (for example, refer to Patent Literature 1).

CITATION LIST

Patent Literature

Patent Literature 1: Japanese Unexamined Patent Publication No. 2013-506154

SUMMARY OF INVENTION

Technical Problem

In transportation of such a Fabry-Perot interference filter, the Fabry-Perot interference filter can be individually accommodated in an accommodating container. On the other hand, an increase in the market demand for the Fabry-Perot interference filter as described above in recent years has led to a necessity to transport a large number of Fabry-Perot interference filters at one time. This makes it necessary to perform repeated operations of accommodating the Fabry-Perot interference filters individually in the accommodating container, leading to concerns of heavier burden due to longer operation time and the risk of occurrence of faulty products due to deterioration in operation accuracy (for example, a risk of occurrence of breakage in a movable mirror due to contact of the accommodating container with the movable mirror). In view of these, a method capable of transporting a large number of Fabry-Perot interference filters with reduced risk of filter breakage is desired.

An object of one aspect of the present invention is to provide a transportation method capable of transporting a large number of Fabry-Perot interference filters with reduced risk of breakage.

Solution to Problem

A transportation method according to one aspect of the present invention is a method for transporting an object including a plurality of Fabry-Perot interference filters, the method including a first step of accommodating the object in an accommodating container, in which the Fabry-Perot interference filter includes a substrate, a first mirror portion and a second mirror portion provided on the substrate and facing each other via a gap and in which a distance from each other is variable, and in the first step, the object is accommodated and supported in the accommodating container in a state where the plurality of Fabry-Perot interference filters is two-dimensionally arranged.

In this method, the transportation object includes a plurality of Fabry-Perot interference filters. In addition, in the first step, the two-dimensionally arranged Fabry-Perot interference filters is accommodated and supported in the accommodating container. In this manner, in a state where the plurality of Fabry-Perot interference filters is arranged two-dimensionally, it is easier to carry out collective accommodation and support while avoiding occurrence of contact with mirror portions such as the first mirror portion and the second mirror portion, compared with a case where the Fabry-Perot interference filters are handled individually. Therefore, this method makes it possible to transport a plurality of (a large number of) Fabry-Perot interference filters with a simple configuration with reduced risk of breakage.

In the transportation method according to one aspect of the present invention, the object may be a wafer in which the plurality of Fabry-Perot interference filters is formed, the wafer may include a first surface on the sides of the first mirror portion and the second mirror portion with respect to the substrate and includes a second surface opposite to the first surface, and in the first step, the object may be accommodated and supported in the accommodating container in a state where the plurality of Fabry-Perot interference filters is two-dimensionally arranged as the wafer. In this case, the plurality of Fabry-Perot interference filters is integrated as a wafer. For this reason, it is possible to transport a large number of (a plurality of) Fabry-Perot interference filters with a simpler configuration with reduced risk of breakage.

In the transportation method according to one aspect of the present invention, the object may include a bonding layer bonded to the second surface, a support body may be provided at an outer edge portion of the bonding layer, a clamping portion configured to clamp the support body may be provided on an inner surface of the accommodating container, and in the first step, the object may be supported in the accommodating container by clamping the support body with the clamping portion. In this case, the object can be supported without bringing the clamping portion into contact with the wafer being the object. This prevents breakage in the Fabry-Perot interference filter due to contact with the clamping portion when the object is accommodated and supported.

In the transportation method according to one aspect of the present invention, in the first step, the object may be supported by vertically clamping the support body with the clamping portion in a state where the first surface faces downward. In this case, the first surface on the side of the mirror portion faces downward in the accommodating container. For this reason, even when the mirror portion is broken in one Fabry-Perot interference filter, fragments of the broken portion are unlikely to influence other Fabry-Perot interference filters.

In the transportation method according to one aspect of the present invention, an effective area including the plurality of Fabry-Perot interference filters and a dummy area provided to surround the effective area so as to form an outer edge may be formed in the wafer, the dummy area may include a plurality of dummy filters in which an intermediate layer is provided between the first mirror portion and the second mirror portion facing each other, a clamping portion configured to clamp the object in the dummy area may be provided on an inner surface of the accommodating container, and in the first step, the object may be supported in the accommodating container by clamping the dummy area with the clamping portion. In this case, the object can be supported in the accommodating container without separately using a member such as a support body. Furthermore, since the dummy area is provided at the outer edge portion of the wafer being the object, the strength of the wafer is improved and the warpage is suppressed. For this reason, the object can be accommodated easily in the accommodating container.

In the transportation method according to one aspect of the present invention, in the first step, the object may be supported in the accommodating container by vertically clamping the dummy area with the clamping portion in a state where the first surface faces downward. In this case, the first surface on the side of the mirror portion faces downward in the accommodating container. For this reason, even when the mirror portion is broken in one Fabry-Perot interference filter, fragments of the broken portion are unlikely to influence other Fabry-Perot interference filters.

In the transportation method according to one aspect of the present invention, the object may include a bonding layer and the plurality of Fabry-Perot interference filters separately formed from each other, the Fabry-Perot interference filter may be two-dimensionally arranged and may be bonded to the bonding layer, a support body may be provided on an outer edge portion of the bonding layer, a clamping portion configured to vertically clamp the support body may be provided on an inner surface of the accommodating container, the Fabry-Perot interference filter may include a first surface on the sides of the first mirror portion and the second mirror portion with respect to the substrate and includes a second surface that is a surface opposite to the first surface and that is bonded to the bonding layer, and in the first step, the object may be supported in the accommodating container by clamping the support body with the clamping portion in a state where the first surface faces downward. In this case, the plurality of Fabry-Perot interference filters formed separately from each other is two-dimensionally arranged so as to be bonded to the bonding layer. This makes it easier to store and support the filters so as not to come in contact with the mirror portion. Furthermore, the first surface faces downward in the accommodating container. For this reason, even when the mirror portion is broken in one Fabry-Perot interference filter, fragments of the broken portion are unlikely to influence other Fabry-Perot interference filters.

In the transportation method according to one aspect of the present invention, a moisture absorbing layer may be provided on a surface of the bonding layer opposite to the second surface, an adsorption layer may be provided on a surface of the moisture absorbing layer opposite to the bonding layer, and in the first step, the object may be accommodated and supported in the accommodating container such that the adsorption layer of one object faces the first surface of another object in a downside of the first surface of another object. In this case, it is possible to dispose the moisture absorbing layer and the adsorption layer in the accommodating container together with accommodating the object into the accommodating container. In particular, in this case, it is possible to dispose the moisture absorbing layer at a position closer to the Fabry-Perot interference filter as compared with a case where a moisture absorbing member is disposed at a bottom of the accommodating container, for example. Furthermore, the adsorption layer is disposed in a downside of the first surface so as to face the first surface. For this reason, even when the mirror portion is broken in one Fabry-Perot interference filter, fragments of the broken portion will be adsorbed onto the adsorption layer, making is possible to prevent the situation in which the broken fragments influence other Fabry-Perot interference filters.

In the transportation method according to one aspect of the present invention may include, after the first step, a second step of accommodating the accommodating container into a vacuum pack and evacuating the inside of the accommodating container by exhausting the vacuum pack. In this case, it is possible to evacuate the inside of the accommodating container without influencing the Fabry-Perot interference filter.

Advantageous Effects of Invention

According to one aspect of the present invention, it is possible to provide a transportation method capable of transporting a large number of Fabry-Perot interference filters with reduced risk of breakage.

DESCRIPTION OF EMBODIMENTS

Figure 1:
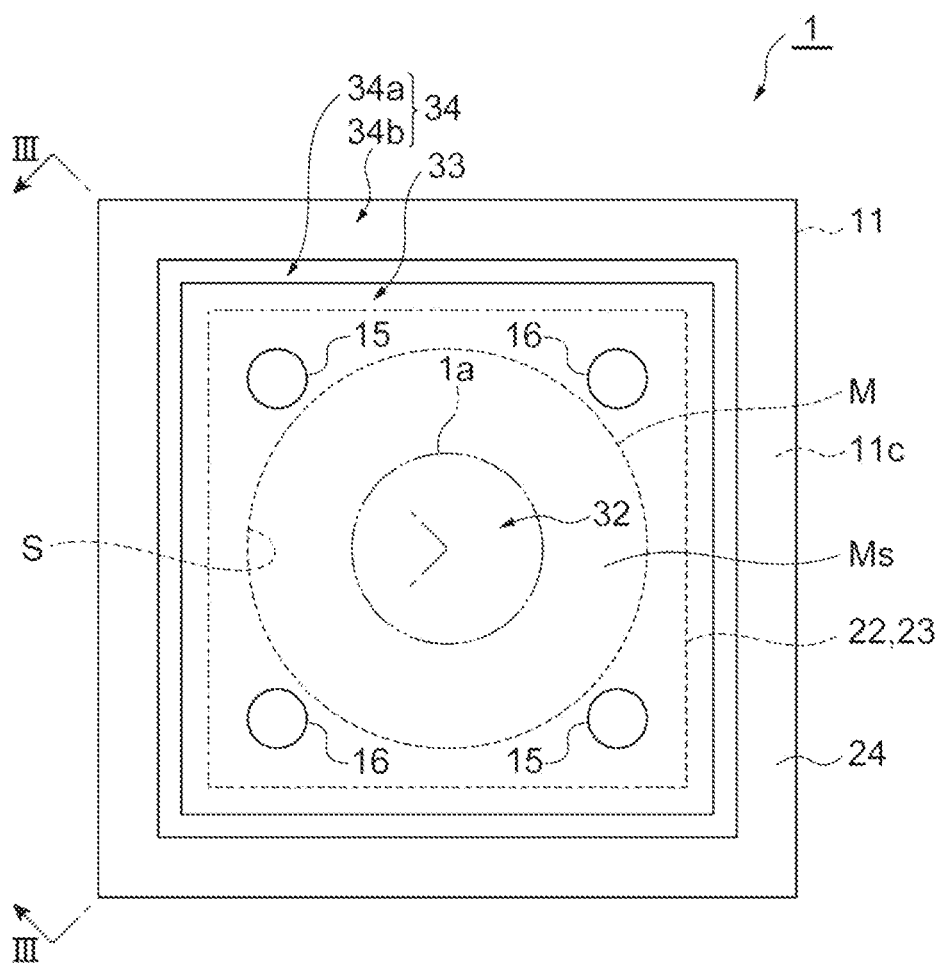
FIG. 1 is a plan view of a Fabry-Perot interference filter of the present embodiment.

Hereinafter, an embodiment will be described in detail with reference to the drawings. In each of the drawings, the same elements or corresponding elements will be denoted by the same reference numerals, and redundant description will be omitted in some cases.

The transportation method according to the present embodiment is a method for transporting an object including a Fabry-Perot interference filter. Therefore, an embodiment of an object including a Fabry-Perot interference filter as a transportation object will be described first.

[Configuration of Fabry-Perot Interference Filter and Dummy Filter]

Figure 2:
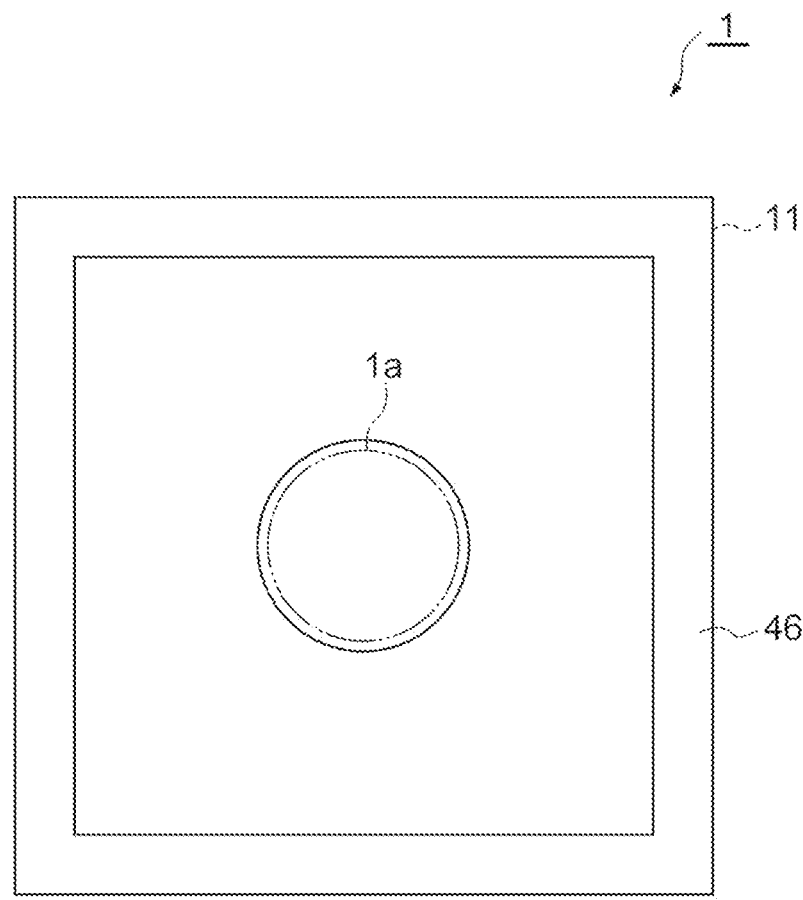
FIG. 2 is a bottom view of the Fabry-Perot interference filter illustrated in FIG. 1.
Figure 3:
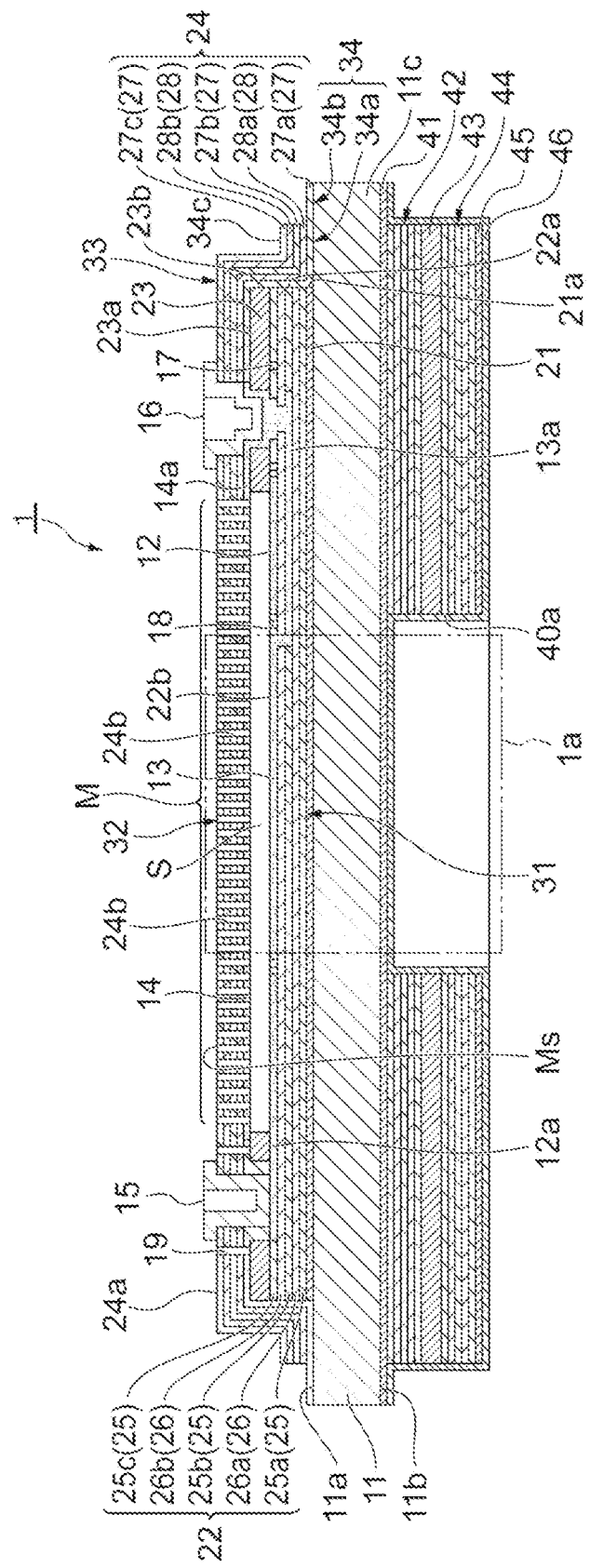
FIG. 3 is a cross-sectional view of the Fabry-Perot interference filter taken along line in FIG. 1.

FIG. 1 is a plan view of a Fabry-Perot interference filter of the present embodiment. FIG. 2 is a bottom view of the Fabry-Perot interference filter illustrated in FIG. 1. FIG. 3 is a cross-sectional view of the Fabry-Perot interference filter taken along line in FIG. 1. As illustrated in FIGS. 1 to 3, a Fabry-Perot interference filter 1 includes a substrate 11. The substrate 11 has a first surface 11a and a second surface 11b opposite to the first surface 11a. On the first surface 11a, a reflection prevention layer 21, a first laminate 22, an intermediate layer 23, and a second laminate 24 are laminated in this order. A gap (air gap) S is defined between the first laminate 22 and the second laminate 24 by the frame-like intermediate layer 23.

The shape and the positional relationship of each of portions when viewed in a direction perpendicular to the first surface 11a (plan view) are as follows. The outer edge of the substrate 11 has a rectangular shape with a side being several hundred μm to several mm. The outer edge of the substrate 11 and an outer edge of the second laminate 24 are aligned with each other. An outer edge of the reflection prevention layer 21, an outer edge of the first laminate 22, and an outer edge of the intermediate layer 23 are aligned with each other. The substrate 11 has an outer edge portion 11c positioned on an outer side of the outer edge of the intermediate layer 23 with respect to the center of the gap S. For example, the outer edge portion 11c has a frame shape and surrounds the intermediate layer 23 when viewed in a direction perpendicular to the first surface 11a. The gap S has a circular shape, for example.

The Fabry-Perot interference filter 1 transmits light having a predetermined wavelength through a light transmission region 1a defined in a center portion of the Fabry-Perot interference filter 1. For example, the light transmission region 1a is a columnar region. The substrate 11 is formed of silicon, quartz, or glass, for example. When the substrate 11 is formed of silicon, the reflection prevention layer 21 and the intermediate layer 23 are formed of silicon oxide, for example. The thickness of the intermediate layer 23 ranges from several tens of nm to several tens of μm, for example.

A portion corresponding to the light transmission region 1a in the first laminate 22 functions as a first mirror portion 31. The first mirror portion 31 is a fixed mirror. The first mirror portion 31 is disposed on the first surface 11a via the reflection prevention layer 21. The first laminate 22 includes alternate laminations of each of a plurality of polysilicon layers 25 and each of a plurality of silicon nitride layers 26. The Fabry-Perot interference filter 1 includes layers of a polysilicon layer 25a, a silicon nitride layer 26a, a polysilicon layer 25b, a silicon nitride layer 26b, and a polysilicon layer 25c laminated on the reflection prevention layer 21 in this order. The optical thickness of each of the polysilicon layers 25 and the silicon nitride layers 26 included in the first mirror portion 31 can be set to an integral multiple of ¼ of a center transmission wavelength. The first mirror portion 31 may be directly disposed on the first surface 11a without interposing the reflection prevention layer 21.

The portion corresponding to the light transmission region 1a in the second laminate 24 functions as a second mirror portion 32. The second mirror portion 32 is a movable mirror. The second mirror portion 32 faces the first mirror portion 31 via the gap S on a side opposite to the substrate 11 with respect to the first mirror portion 31. The direction in which the first mirror portion 31 and the second mirror portion 32 face each other is parallel to a direction perpendicular to the first surface 11a. The second laminate 24 is disposed on the first surface 11a via the reflection prevention layer 21, the first laminate 22, and the intermediate layer 23. The second laminate 24 includes alternate laminations of each of the plurality of polysilicon layers 27 and each of the plurality of silicon nitride layers 28. The Fabry-Perot interference filter 1 includes layers of a polysilicon layer 27a, a silicon nitride layer 28a, a polysilicon layer 27b, a silicon nitride layer 28b, and a polysilicon layer 27c laminated on the intermediate layer 23 in this order. The optical thickness of each of the polysilicon layers 27 and the silicon nitride layers 28 included in the second mirror portion 32 can be set to an integral multiple of ¼ of a center transmission wavelength.

In the first laminate 22 and the second laminate 24, silicon oxide layers may be used in place of the silicon nitride layers. In addition, examples of the material applicable for each of layers forming the first laminate 22 and the second laminate 24 include titanium oxide, tantalum oxide, zirconium oxide, magnesium fluoride, aluminum oxide, calcium fluoride, silicon, germanium, zinc sulfide, or the like. Here, the surface of the first mirror portion 31 on the gap S side (surface of the polysilicon layer 25c) and the surface of the second mirror portion 32 on the gap S side (surface of the polysilicon layer 27a) directly face each other via the gap S. Note that an electrode layer, a protective layer, or the like (not forming a mirror) may be formed on the surface of the first mirror portion 31 on the gap S side and on the surface of the second mirror portion 32 on the gap S side. In this case, the first mirror portion 31 and the second mirror portion 32 face each other via the gap S with the presence of these interposed layers. In other words, even in such a case, a facing configuration between the first mirror portion 31 and the second mirror portion 32 via the gap S can be achieved.

A plurality of through-holes 24b is formed at a portion of the second laminate 24 corresponding to the gap S (a portion overlapping the gap S when viewed in a direction perpendicular to the first surface 11a). Each of the through-holes 24b extends to reach the gap S from a surface 24a of the second laminate 24 opposite to the intermediate layer 23. The plurality of through-holes 24b is formed so as not to substantially influence the function of the second mirror portion 32. The plurality of through-holes 24b is used for forming the gap S by removing a portion of the intermediate layer 23 through etching.

In addition to the second mirror portion 32, the second laminate 24 further includes a covering portion 33 and a peripheral edge portion 34. The second mirror portion 32, the covering portion 33, and the peripheral edge portion 34 are integrally formed to have a portion of a same laminated structure and to be continuous to each other. The covering portion 33 surrounds the second mirror portion 32 when viewed in a direction perpendicular to the first surface 11a. The covering portion 33 covers a surface 23a of the intermediate layer 23 on a side opposite to the substrate 11, a side surface 23b of the intermediate layer 23 (a side surface on the outer side, that is, a side surface on a side opposite to the gap S side), a side surface 22a of the first laminate 22, and a side surface 21a of the reflection prevention layer 21, so as to reach the first surface 11a. That is, the covering portion 33 covers the outer edge of the intermediate layer 23, the outer edge of the first laminate 22, and the outer edge of the reflection prevention layer 21.

The peripheral edge portion 34 surrounds the covering portion 33 when viewed in a direction perpendicular to the first surface 11a. The peripheral edge portion 34 is positioned on the first surface 11a in the outer edge portion 11c. The outer edge of the peripheral edge portion 34 is aligned with the outer edge of the substrate 11 when viewed in a direction perpendicular to the first surface 11a. The peripheral edge portion 34 is thinned along an outer edge of the outer edge portion 11c. That is, the portion along the outer edge of the outer edge portion 11c in the peripheral edge portion 34 is thinner compared to other portions excluding the portion along the outer edge of the peripheral edge portion 34. In the Fabry-Perot interference filter 1, the peripheral edge portion 34 is thinned by removing a portion of the polysilicon layer 27 and the silicon nitride layer 28 included in the second laminate 24. The peripheral edge portion 34 includes a non-thinned portion 34a continuous to the covering portion 33, and a thinned portion 34b surrounding the non-thinned portion 34a. In the thinned portion 34b, the polysilicon layer 27 and the silicon nitride layer 28 are removed excluding the polysilicon layer 27a directly provided on the first surface 11a.

The height from the first surface 11a to a surface 34c of the non-thinned portion 34a on a side opposite to the substrate 11 is lower than the height from the first surface 11a to the surface 23a of the intermediate layer 23. The height from the first surface 11a to the surface 34c of the non-thinned portion 34a ranges from 100 nm to 5000 nm, for example. The height from the first surface 11a to the surface 23a of the intermediate layer 23 ranges from 500 nm to 20000 nm, for example. The width of the thinned portion 34b (distance between the outer edge of the non-thinned portion 34a and the outer edge of the outer edge portion 11c when viewed in the direction perpendicular to the first surface 11a) is 0.01 times the thickness of the substrate 11, or more. The width of the thinned portion 34b ranges from 5 μm to 400 μm, for example. The thickness of the substrate 11 ranges from 500 μm to 800 μm, for example.

A first electrode 12 is formed in the first mirror portion 31 so as to surround the light transmission region 1a when viewed in a direction perpendicular to the first surface 11a. The first electrode 12 is formed by doping impurities into the polysilicon layer 25c to achieve low resistivity. A second electrode 13 is formed in the first mirror portion 31 so as to include the light transmission region 1a when viewed in a direction perpendicular to the first surface 11a. The second electrode 13 is formed by doping impurities into the polysilicon layer 25c to achieve low resistivity. Note that although the second electrode 13 can be sized to include the entire light transmission region 1a when viewed in a direction perpendicular to the first surface 11a, the second electrode 13 may be set to substantially the same size as that of the light transmission region 1a.

A third electrode 14 is formed in the second mirror portion 32. The third electrode 14 faces the first electrode 12 and the second electrode 13 via the gap S. The third electrode 14 is formed by doping impurities into the polysilicon layer 27a to achieve low resistivity.

A pair of terminals 15 are provided to face each other across the light transmission region 1a. Each of the terminals 15 is disposed inside a through-hole leading from the surface 24a of the second laminate 24 to the first laminate 22. Each of the terminals 15 is electrically connected to the first electrode 12 through wiring 12a. For example, each of the terminals 15 is formed with a metal film of aluminum, an alloy thereof, or the like.

A pair of terminals 16 are provided to face each other across the light transmission region 1a. Each of the terminals 16 is disposed inside a through-hole leading from the surface 24a of the second laminate 24 to the first laminate 22. Each of the terminals 16 is electrically connected to the second electrode 13 through wiring 13a and is electrically connected to the third electrode 14 through wiring 14a. For example, the terminals 16 are formed with a metal film of aluminum, an alloy thereof, or the like. The facing direction of the pair of terminals 15 and the facing direction of the pair of terminals 16 are orthogonal to each other (refer to FIG. 1).

A plurality of trenches 17 and 18 is provided on a surface 22b of the first laminate 22. The trench 17 annularly extends to surround a connection with respect to the terminals 16 in the wiring 13a. The trench 17 electrically insulates the first electrode 12 and the wiring 13a from each other. The trench 18 annularly extends along an inner edge of the first electrode 12. The trench 18 electrically insulates the first electrode 12 and a region of the first electrode 12 on an inner side (second electrode 13) from each other. Each of the regions in the trenches 17 and 18 may be an insulating material or a gap.

A trench 19 is provided on the surface 24a of the second laminate 24. The trench 19 annularly extends to surround the terminals 15. The trench 19 electrically insulates the terminals 15 and the third electrode 14 from each other. The region inside the trench 19 may be an insulating material or a gap.

The second surface 11b of the substrate 11 includes layers of a reflection prevention layer 41, a third laminate 42, an intermediate layer 43, and a fourth laminate 44 laminated in this order. The reflection prevention layer 41 and the intermediate layer 43 each have a configuration similar to those of the reflection prevention layer 21 and the intermediate layer 23. The third laminate 42 and the fourth laminate 44 each have a laminated structure symmetrical to those of the first laminate 22 and the second laminate 24 with respect to the substrate 11. The reflection prevention layer 41, the third laminate 42, the intermediate layer 43, and the fourth laminate 44 have a function of suppressing warpage of the substrate 11.

The third laminate 42, the intermediate layer 43, and the fourth laminate 44 are thinned along the outer edge of the outer edge portion 11c. That is, the portion along the outer edge of the outer edge portion 11c in the third laminate 42, the intermediate layer 43, and the fourth laminate 44 is thinner compared to other portions excluding the portion along the outer edge in the third laminate 42, the intermediate layer 43, and the fourth laminate 44. In the Fabry-Perot interference filter 1, the third laminate 42, the intermediate layer 43, and the fourth laminate 44 are thinned by removing all of the third laminate 42, the intermediate layer 43, and the fourth laminate 44 in a portion overlapping the thinned portion 34b when viewed in a direction perpendicular to the first surface 11a.

The third laminate 42, the intermediate layer 43, and the fourth laminate 44 have an opening 40a so as to include the light transmission region 1a when viewed in a direction perpendicular to the first surface 11a. The opening 40a has a diameter approximately the same as the size of the light transmission region 1a. The opening 40a is open on the light emission side. The bottom surface of the opening 40a reaches the reflection prevention layer 41.

A light shielding layer 45 is formed on a surface of the fourth laminate 44 on the light emission side. For example, the light shielding layer 45 is formed of aluminum or the like. A protective layer 46 is formed on a surface of the light shielding layer 45 and an inner surface of the opening 40a. The protective layer 46 covers the outer edges of the third laminate 42, the intermediate layer 43, the fourth laminate 44, and the light shielding layer 45 and covers the reflection prevention layer 41 on the outer edge portion 11c. For example, the protective layer 46 is formed of aluminum oxide. An optical influence due to the protective layer 46 can be disregarded by causing the thickness of the protective layer 46 to range from 1 nm to 100 nm (approximately 30 nm, for example).

In the Fabry-Perot interference filter 1 configured as described above, when a voltage is applied between the first electrode 12 and the third electrode 14 via the pair of terminals 15 and 16, an electrostatic force corresponding to the voltage is generated between the first electrode 12 and the third electrode 14. The second mirror portion 32 is attracted to the first mirror portion 31 side secured to the substrate 11 by the electrostatic force, and the distance between the first mirror portion 31 and the second mirror portion 32 is adjusted. In this manner, in the Fabry-Perot interference filter 1, the distance between the first mirror portion 31 and the second mirror portion 32 changes by the electrostatic force.

The wavelength of light to be transmitted through the Fabry-Perot interference filter 1 depends on the distance between the first mirror portion 31 and the second mirror portion 32 in the light transmission region 1a. Therefore, the wavelength of light to be transmitted can be appropriately selected by adjusting the voltage to be applied between the first electrode 12 and the third electrode 14. At this time, the second electrode 13 has the same potential as that of the third electrode 14. Therefore, the second electrode 13 functions as a compensation electrode to keep the first mirror portion 31 and the second mirror portion 32 flat in the light transmission region 1a.

In the Fabry-Perot interference filter 1, for example, a spectroscopic spectrum can be obtained by detecting light transmitted through the light transmission region 1a of the Fabry-Perot interference filter 1 using a light detector while changing the voltage to be applied to the Fabry-Perot interference filter 1 (that is, while changing the distance between the first mirror portion 31 and the second mirror portion 32 in the Fabry-Perot interference filter 1).

In this manner, the Fabry-Perot interference filter 1 has a membrane structure M including the first mirror portion 31 and the second mirror portion 32 facing each other via the gap S and in which a distance from each other is variable. The membrane structure M includes a main surface Ms opposite to the substrate 11. The membrane structure M is a portion not overlapping the intermediate layer 23 in the first laminate 22 and the second laminate 24 when viewed in a direction intersecting (orthogonal to) the first surface 11a of the substrate 11 and the main surface Ms. That is, the outer shape of the membrane structure M when viewed in the direction intersecting (orthogonal to) the main surface Ms is defined by an inner edge of the intermediate layer 23, illustrated here in a circular shape (refer to FIG. 1).

Figure 4:
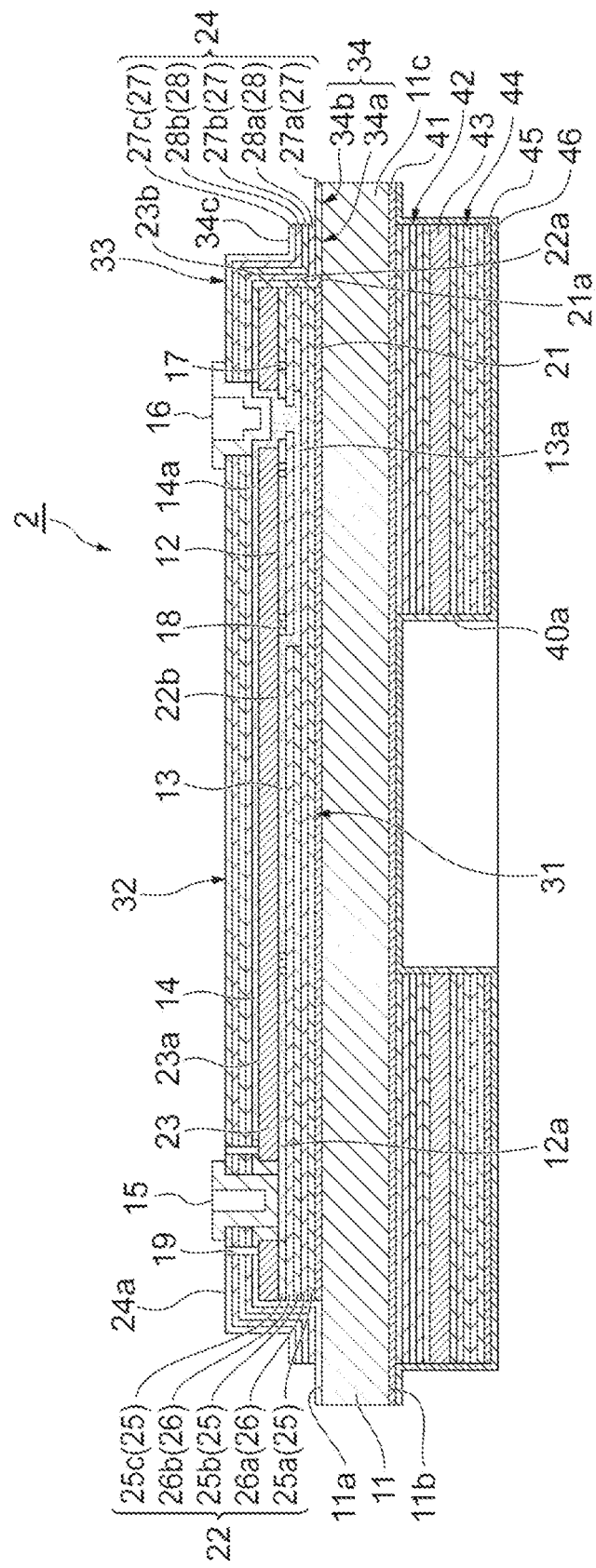
FIG. 4 is a cross-sectional view of a dummy filter according to the present embodiment.

FIG. 4 is a cross-sectional view of a dummy filter according to the present embodiment. As illustrated in FIG. 4, a dummy filter 2 is different from the Fabry-Perot interference filter 1 described above in that the plurality of through-holes 24b is not formed in the second laminate 24 and the gap S is not formed in the intermediate layer 23. In the dummy filter 2, an intermediate layer 23 is provided between the first mirror portion 31 and the second mirror portion 32. That is, the second mirror portion 32 is disposed on the surface 23a of the intermediate layer 23, not floating above the gap S.

[Wafer Configuration]

Figure 5:
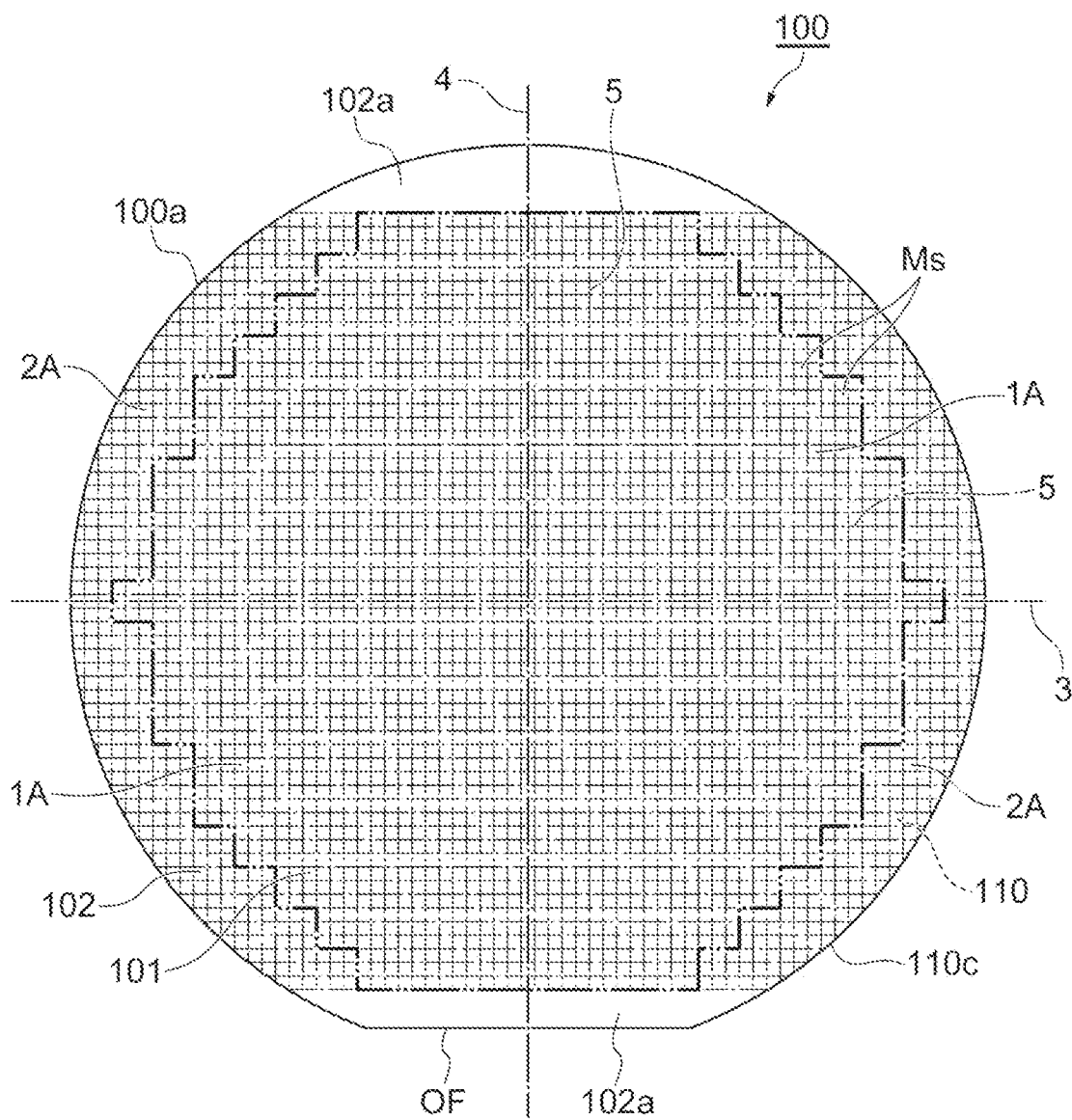
FIG. 5 is a plan view of a wafer according to the present embodiment.
Figure 6:
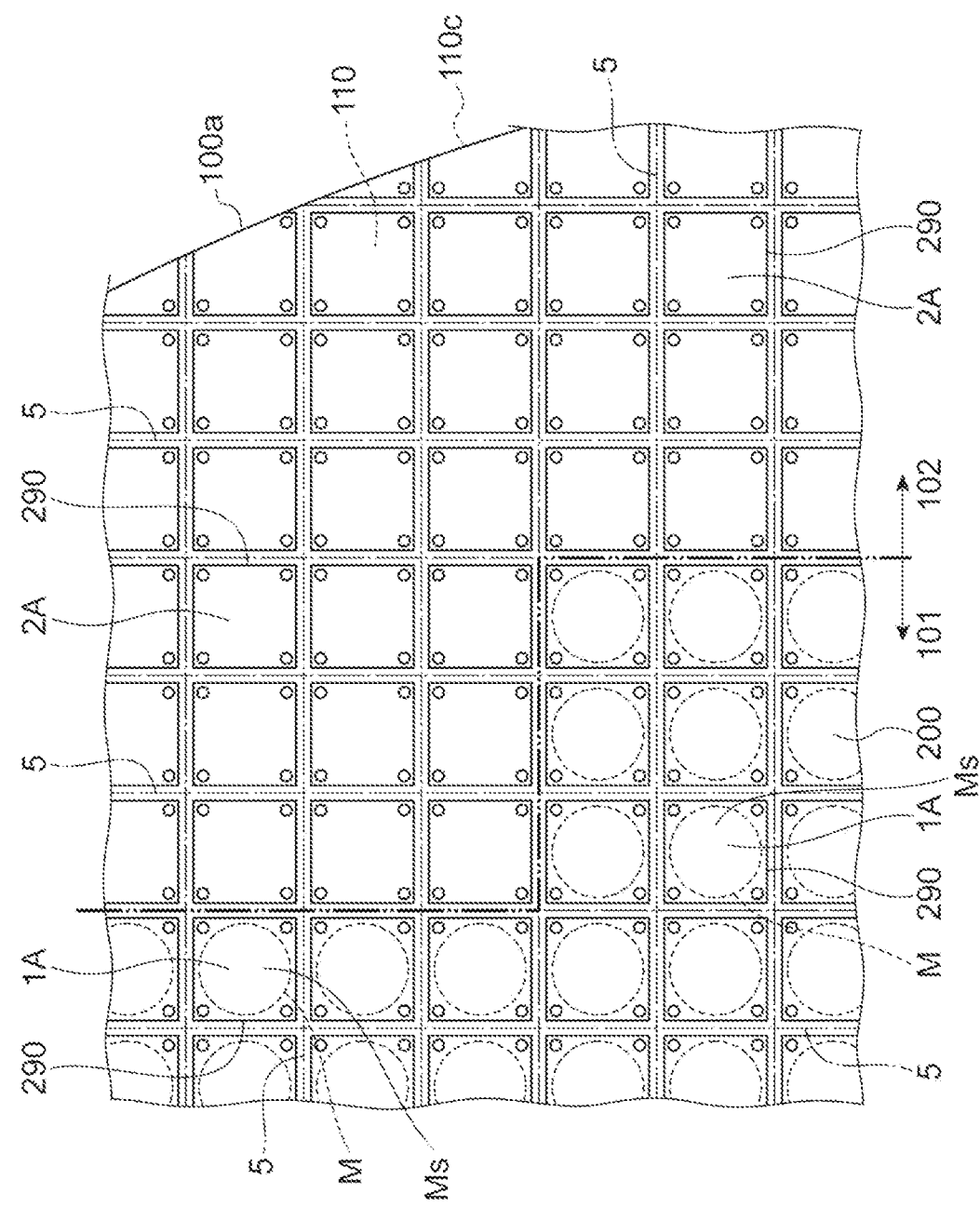
FIG. 6 is an enlarged plan view of a part of the wafer illustrated in FIG. 5.

Next, a configuration of a wafer according to an embodiment will be described. FIG. 5 is a plan view of the wafer according to the present embodiment. FIG. 6 is an enlarged plan view of a portion of the wafer illustrated in FIG. 5. As illustrated in FIGS. 5 and 6, a wafer 100 includes a substrate layer 110. The substrate layer 110 has a disk shape with a diameter of approximately 150 mm or 200 mm, with an orientation flat OF formed in a portion of the substrate layer 110. For example, the substrate layer 110 is formed of silicon, quartz, glass, or the like. Hereinafter, a virtual straight line that passes through the center of the substrate layer 110 when viewed in the thickness direction of the substrate layer 110 and is parallel to the orientation flat OF is referred to as a first straight line 3, while a virtual straight line that passes through the center of the substrate layer 110 when viewed in the thickness direction of the substrate layer 110 and is perpendicular to the orientation flat OF is referred to as a second straight line 4.

The wafer 100 includes an effective area 101 and a dummy area 102. The dummy area 102 is an area along an outer edge 110c of the substrate layer 110 (that is, an outer edge 100a of the wafer 100) (so as to form the outer edge 100a). The effective area 101 is an area inside the dummy area 102. The dummy area 102 surrounds the effective area 101 when viewed in the thickness direction of the substrate layer 110. The dummy area 102 is adjacent to the effective area 101.

The effective area 101 includes a plurality of two-dimensionally arranged Fabry-Perot interference filter portions 1A. The plurality of Fabry-Perot interference filter portions 1A is provided in the entire effective area 101. The dummy area 102 includes a plurality of two-dimensionally arranged dummy filter portions 2A. The plurality of dummy filter portions 2A is provided in an area of the dummy area 102 excluding a pair of areas 102a. One area 102a is an area along the orientation flat OF. The other area 102a is an area along the portion of the outer edge 110c of the substrate layer 110 on the side opposite to the orientation flat OF. The Fabry-Perot interference filter portion 1A and the dummy filter portion 2A are adjacent to each other at a boundary between the effective area 101 and the dummy area 102. When viewed in the thickness direction of the substrate layer 110, the outer shape of the Fabry-Perot interference filter portion 1A and the outer shape of the dummy filter portion 2A are the same. The plurality of Fabry-Perot interference filter portions 1A and the plurality of dummy filter portions 2A are arranged so as to be symmetric about each of the first straight line 3 and the second straight line 4 orthogonal to each other. The plurality of dummy filter portions 2A may be provided over the entire dummy area 102. Furthermore, the plurality of dummy filter portions 2A may be provided in an area other than one of the areas 102a in the dummy areas 102.

Each of the plurality of Fabry-Perot interference filter portions 1A is to be each of a plurality of Fabry-Perot interference filters 1 when the wafer 100 is cut along each of lines 5. Each of the plurality of dummy filter portions 2A is to be each of a plurality of dummy filters 2 when the wafer 100 is cut along each of the lines 5. When viewed in the thickness direction of the substrate layer 110, the plurality of lines 5 extends in a direction parallel to the orientation flat OF, and the plurality of lines 5 extends in a direction perpendicular to the orientation flat OF. As an example, when each of the filter portions 1A and 2A has a rectangular shape when viewed in the thickness direction of the substrate layer 110, each of the filter portions 1A and 2A is arranged in a two-dimensional matrix, and the plurality of lines 5 is set in a lattice pattern so as to pass between adjacent filter portions 1A-1A, between adjacent filter portions 1A-2A, and between adjacent filter portions 2A-2A. Here, as illustrated in FIG. 5, among the plurality of Fabry-Perot interference filter portions 1A and dummy filter portions 2A arranged in a two-dimensional array, a 3×3 array including a certain Fabry-Perot interference filter portion 1A or a dummy filter portion 2A and including the Fabry-Perot interference filter 1 and/or the dummy filter portion 2A surrounding the certain Fabry-Perot interference filter portion 1A or the dummy filter portion 2A is to be defined as a unit array. At this time, a plurality of the unit arrays is individually arranged in four regions divided by a first straight line 3 and a second straight line 4 in the wafer 100. In addition, the same number of unit arrays are arranged in each of the four regions divided by the first straight line 3 and the second straight line 4. Furthermore, here, the unit arrays are arranged symmetrically with respect to the first straight line 3 and the second straight line 4. A unit array has its width (surface area) larger than its thickness (cross-sectional area).

Figure 7:
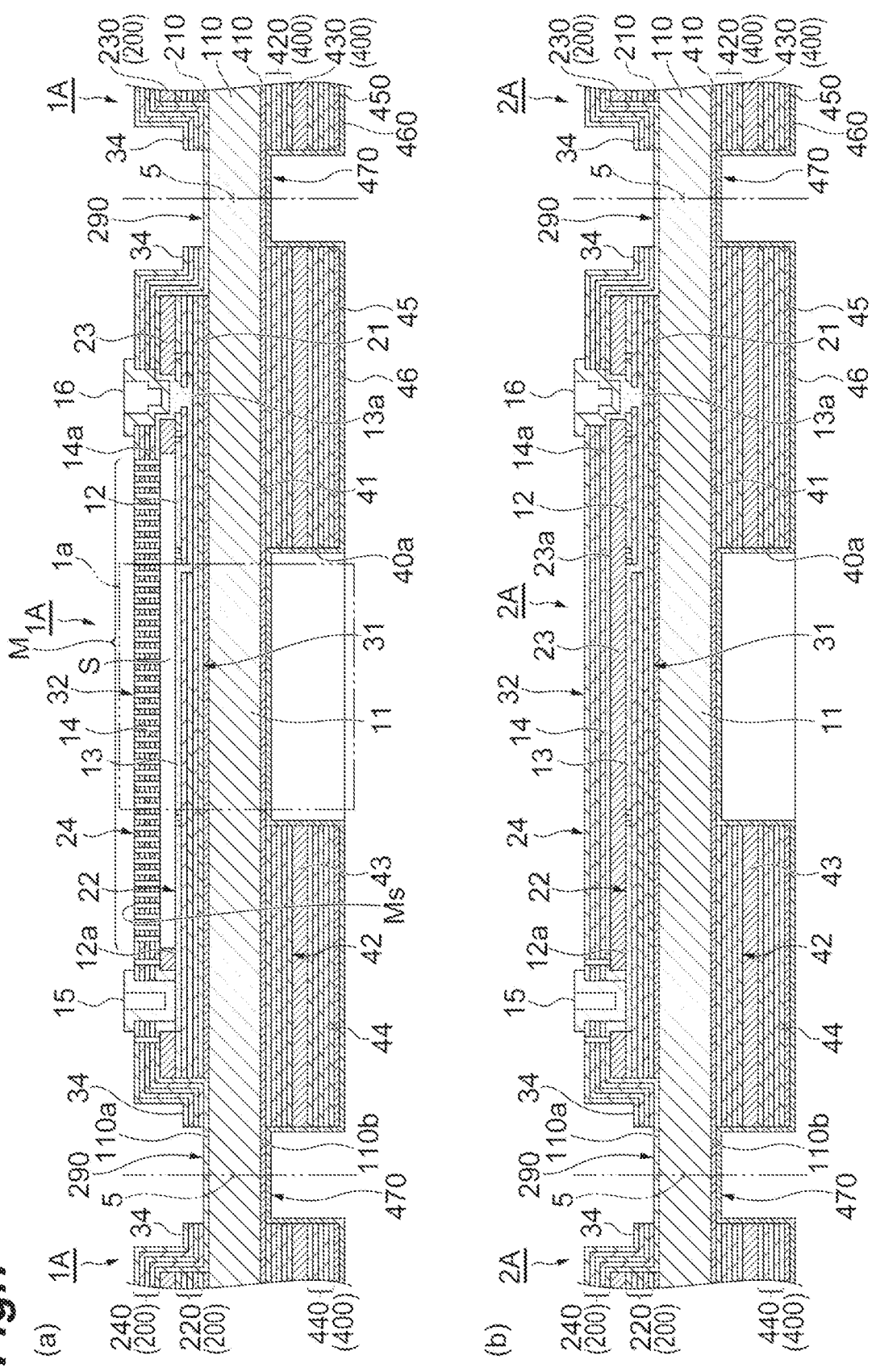
FIG. 7 is a cross-sectional view of a Fabry-Perot interference filter portion and a dummy filter portion of the wafer illustrated in FIG. 5.

(a) of FIG. 7 is a cross-sectional view of the Fabry-Perot interference filter portion 1A. (b) of FIG. 7 is a cross-sectional view of the dummy filter portion 2A. As illustrated in (a) and (b) of FIG. 7, the substrate layer 110 is a layer that is to be a plurality of substrates 11 when the wafer 100 is cut along each of the lines 5. The substrate layer 110 has a first surface 110a and a second surface 110b opposite to the first surface 110a. A reflection prevention layer 210 is provided on the first surface 110a of the substrate layer 110. The reflection prevention layer 210 is a layer to be a plurality of reflection prevention layers 21 when the wafer 100 is cut along each of the lines 5. A reflection prevention layer 410 is provided on the second surface 110b of the substrate layer 110. The reflection prevention layer 410 is a layer to be a plurality of reflection prevention layers 41 when the wafer 100 is cut along each of the lines 5.

A device layer 200 is provided on the reflection prevention layer 210. The device layer 200 includes a first mirror layer 220, an intermediate layer 230, and a second mirror layer 240. The first mirror layer 220 is a layer having a plurality of first mirror portions 31, and is a layer to be a plurality of first laminates 22 when the wafer 100 is cut along each of the lines 5. The plurality of first mirror portions 31 is two-dimensionally arranged on the first surface 110a of the substrate layer 110 via the reflection prevention layer 210. The intermediate layer 230 is a layer to be a plurality of intermediate layers 23 when the wafer 100 is cut along each of the lines 5. The second mirror layer 240 is a layer having a plurality of second mirror portions 32, and is a layer to be a plurality of second laminates 24 when the wafer 100 is cut along each of the lines 5. The plurality of second mirror portions 32 is two-dimensionally arranged on the first mirror layer 220 via the intermediate layer 23.

A stress adjustment layer 400 is provided on the reflection prevention layer 410. That is, the stress adjustment layer 400 is provided on the second surface 110b of the substrate layer 110 via the reflection prevention layer 410. The stress adjustment layer 400 includes a plurality of layers 420, 430, and 440. The layer 420 is a layer that is to be a plurality of third laminates 42 when the wafer 100 is cut along each of the lines 5. The layer 430 is a layer to be a plurality of intermediate layers 43 when the wafer 100 is cut along each of the lines 5. The layer 440 is a layer to be a plurality of fourth laminates 44 when the wafer 100 is cut along each of the lines 5.

A light shielding layer 450 and a protective layer 460 are provided on the stress adjustment layer 400. The light shielding layer 450 is a layer that is to be a plurality of light shielding layers 45 when the wafer 100 is cut along each of the lines 5. The protective layer 460 is a layer that is to be a plurality of protective layers 46 when the wafer 100 is cut along each of the lines 5.

As illustrated in (a) of FIG. 7, each of the Fabry-Perot interference filter portions 1A has a gap S formed between the first mirror portion 31 and the second mirror portion 32 facing each other. That is, in each of the Fabry-Perot interference filter portions 1A, the intermediate layer 23 defines the gap S, and the second mirror portion 32 floats on the gap S. Similarly to the configuration of the Fabry-Perot interference filter 1 described above, each of the Fabry-Perot interference filter portions 1A includes a configuration related to the first electrode 12, the second electrode 13, the third electrode 14, the plurality of terminals 15 and 16, the opening 40a, and the like. Therefore, even when the plurality of Fabry-Perot interference filter portions 1A is still in the state of the wafer 100, applying a voltage to each of the Fabry-Perot interference filter portions 1A via the pair of terminals 15 and 16 would change the distance between the first mirror portion 31 and the second mirror portion 32 facing each other by the electrostatic force. In this manner, a plurality of two-dimensionally arranged Fabry-Perot interference filters 1 is already formed and fixed in the wafer 100 (the relative positions to each other are fixed). Furthermore, the effective area 101 includes the plurality of Fabry-Perot interference filters 1.

As illustrated in (b) of FIG. 7, each of the dummy filter portions 2A includes the intermediate layer 23 provided between the first mirror portion 31 and the second mirror portion 32 facing each other. That is, in the dummy filter portion 2A, the intermediate layer 23 does not define the gap S, and the second mirror portion 32 is disposed on the surface 23a of the intermediate layer 23. Accordingly, although each of the dummy filter portions 2A has a configuration related to the first electrode 12, the second electrode 13, the third electrode 14, the plurality of terminals 15 and 16, the openings 40a, and the like, similarly to the configuration of the dummy filter 2 described above, the distance between the first mirror portion 31 and the second mirror portion 32 facing each other would not change. Note that each of the dummy filter portions 2A does not need to include the configuration related to the first electrode 12, the second electrode 13, the third electrode 14, the plurality of terminals 15 and 16 (a metal film such as aluminum to form each of the terminal 15 and 16, through-holes for disposing each of the terminals 15 and 16, and the like), the opening 40a, and the like. In this manner, a plurality of two-dimensionally arranged dummy filters 2 is already formed and fixed in the wafer 100 (the relative positions to each other are fixed). Furthermore, the dummy area 102 includes the plurality of dummy filters 2.

As illustrated in FIG. 6 and (a) of FIG. 7, the device layer 200 has a first groove 290 opening on the side opposite to the substrate layer 110. The first groove 290 is formed along each of the lines 5. The first groove 290 surrounds the first mirror portion 31, the intermediate layer 23, and the second mirror portion 32 in each of the Fabry-Perot interference filter portions 1A and each of the dummy filter portions 2A. In each of the Fabry-Perot interference filter portions 1A, the first mirror portion 31, the intermediate layer 23, and the second mirror portion 32 are surrounded by the annularly continuous first groove 290. Similarly, in each of the dummy filter portions 2A, the first mirror portion 31, the intermediate layer 23, and the second mirror portion 32 are surrounded by the annularly continuous first groove 290. Focusing on the adjacent filter portions 1A,-1A, the adjacent filter portions 1A-2A, and the adjacent filter portions 2A-2A, the first groove 290 corresponds to a region on a peripheral edge portion 34 of one filter portion and a peripheral edge portion 34 of the other filter portion. The first groove 290 is continuous through the effective area 101 and the dummy area 102, and reaches the outer edge 110c of the substrate layer 110 when viewed in a direction in which the first mirror portion 31 and the second mirror portion 32 face each other (hereinafter, simply referred to as a "facing direction"). It is sufficient as long as the first groove 290 surrounds at least the second mirror portion 32 in each of the Fabry-Perot interference filter portions 1A and each of the dummy filter portions 2A.

As illustrated in (b) of FIG. 7, the stress adjustment layer 400 has a second groove 470 opening on the side opposite to the substrate layer 110. The second groove 470 is formed along each of the lines 5. That is, the second groove 470 is formed so as to correspond to the first groove 290. Here, formation of the second groove 470 corresponding to the first groove 290 means that the second groove 470 overlaps the first groove 290 when viewed in the facing direction. Therefore, the second groove 470 is continuous in the effective area 101 and the dummy area 102 and reaches the outer edge 110c of the substrate layer 110 when viewed in the facing direction.

When manufacturing the Fabry-Perot interference filter 1 and the dummy filter 2 from above mentioned wafer 100, first, an expanding tape (an example of a bonding layer 501 described below) is attached onto the protective layer 460 (that is, on the second surface 110b side). Subsequently, laser light is applied from a side opposite to the expanding tape in a state where the expanding tape is attached to the second surface 110b side, and then a converging point of the laser light L is relatively moved along each of the lines 5 while the converging point of the laser light is positioned in the substrate layer 110. That is, the laser light is introduced to be incident on the substrate layer 110 from the side opposite to the expanding tape through the surface of the polysilicon layer exposed in the first groove 290.

With the irradiation of the laser light, a modified region is formed in the substrate layer 110 along each of the lines 5. The modified region is a region having physical characteristics such as density, a refractive index, mechanical strength different from those in the surrounding area, and is a region to be a start point of a fracture extending in a thickness direction of the substrate layer 110. Examples of the modified region include molten processed regions (which means at least any one of a region resolidified after melting, a region in a melted state, and a region in a state of being resolidified from the melted state), a crack region, a dielectric breakdown region, a refractive index changed region or the like, or a mixed region thereof. Further examples of the modified region include a region where the density of the modified region has changed from that of an unmodified region, a region with a lattice defect, or the like, in the material of the substrate layer 110. When the material of the substrate layer 110 is monocrystalline silicon, the modified region can also be defined as a high-dislocation density region. The number of rows of the modified regions arranged in the thickness direction of the substrate layer 110 with respect to each of the lines 5 is appropriately adjusted on the basis of the thickness of the substrate layer 110.

Subsequently, the expanding tape attached to the second surface 110b side is expanded so as to extend the fracture in the thickness direction of the substrate layer 110 from the modified region formed in the substrate layer 110, and then, the substrate layer 110 is cut into the plurality of substrates 11 along each of the lines 5. At this time, the polysilicon layer of the second mirror layer 240 is cut along each of the lines 5 in the first groove 290, while the reflection prevention layer 410 and the protective layer 460 are cut along each of the lines 5 in the second groove 470. With this procedure, a plurality of Fabry-Perot interference filters 1 and the plurality of dummy filters 2 in a state of being separated from each other on the expanding tape are obtained.

[One Embodiment of Transportation Method]

Figure 8:
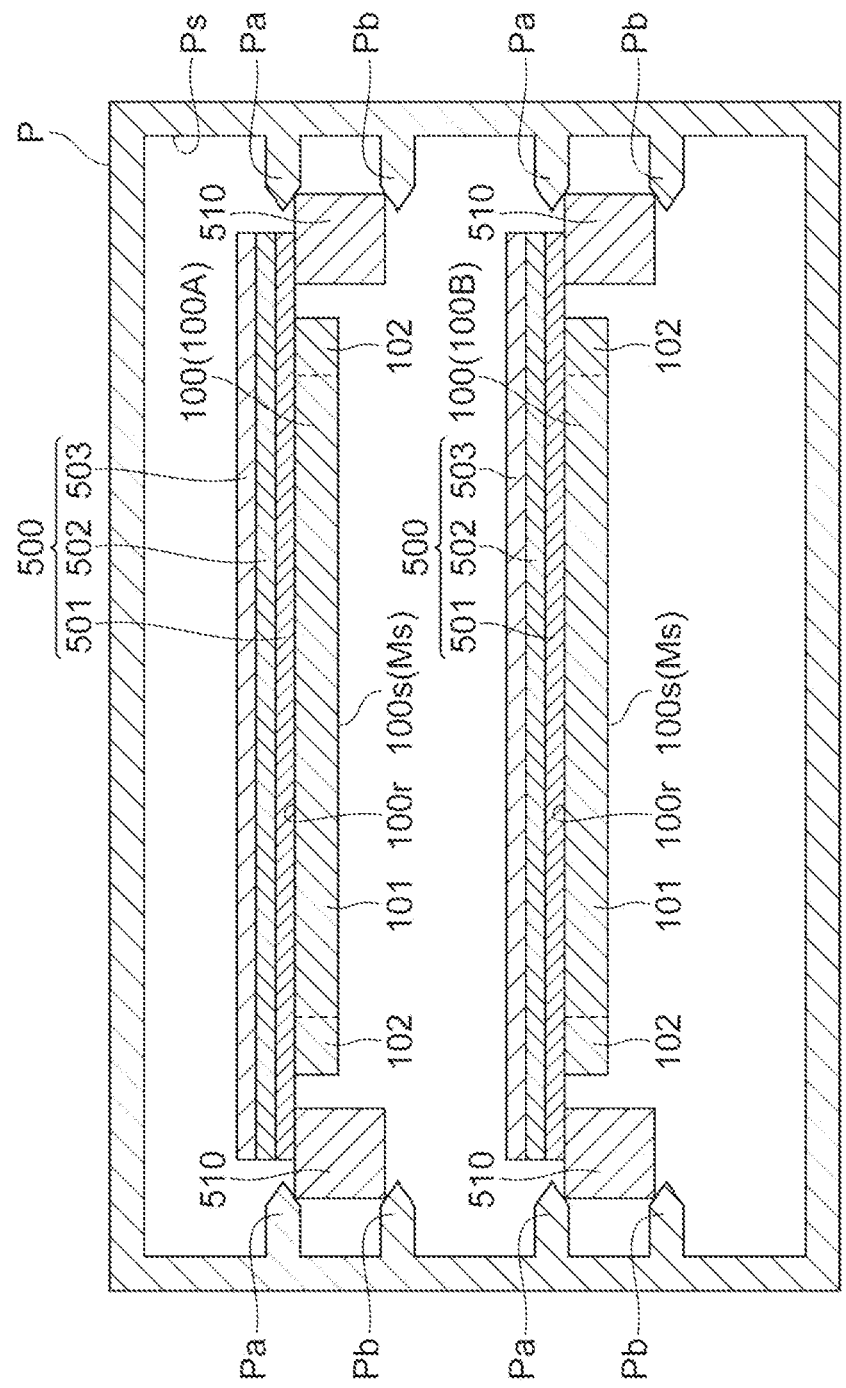
FIG. 8 is a schematic cross-sectional view illustrating an example of a transportation method according to the present embodiment.

FIG. 8 is a schematic cross-sectional view illustrating an example of a transportation method according to the present embodiment. As illustrated in FIG. 8, in the transportation method according to the present embodiment, the wafer 100 is represented by each of objects 100A and 100B of transportation. That is, here, as illustrated in FIGS. 5 to 8, the objects 100A and 100B including a plurality of two-dimensionally arranged Fabry-Perot interference filters 1 as the Fabry-Perot interference filter portions 1A are to be transported. More specifically, each of the objects 100A and 100B is the wafer 100 in which a plurality of Fabry-Perot interference filters 1 and a plurality of dummy filters 2 are formed. As described above, in the wafer 100, the effective area 101 including the plurality of Fabry-Perot interference filters 1 (Fabry-Perot interference filter portions 1A), and the dummy area 102 surrounding the effective area 101 to form an outer edge of the wafer 100 are formed. The wafer 100 includes a main surface (first surface) 100s and a back surface (second surface) 100r opposite to the main surface 100s. The main surface 100s is a surface on the side of the first mirror portion 31 and the second mirror portion 32 with respect to the substrate 11 (substrate layer 110). Here, the main surface 100s is a surface including the main surface Ms of the membrane structure M of each of the Fabry-Perot interference filters 1, and a surface including an outer surface of the second mirror portion 32. The back surface 100r is a surface opposite to the main surface 100s. Here, the back surface 100r is a surface opposite to the main surface Ms of the membrane structure M of each of the Fabry-Perot interference filters 1 as well as being an outer surface of the protective layer 460.

As illustrated in FIG. 8, a film 500 is attached to the objects 100A and 100B. The film 500 is attached on the back surface 100r of the objects 100A and 100B. In contrast, the main surfaces 100s of the objects 100A and 100B are exposed to the atmosphere without any contact (that is, there is no member or the like in contact with the main surface 100s). Here, the plurality of Fabry-Perot interference filters 1 is arranged two-dimensionally in a state of being oriented in a same direction (direction in which the main surface Ms faces the side opposite to the bonding layer 501). That is, the main surfaces Ms of the membrane structures M of the individual Fabry-Perot interference filters 1 are located on a same plane.

The film 500 has various functions. That is, the film 500 includes the bonding layer 501, a moisture absorbing layer 502, and an adsorption layer 503. The bonding layer 501 is bonded to the back surface 100r and forms a contact with the back surface 100r. In other words, each of the objects 100A and 100B further includes the bonding layer 501 bonded to the back surface 100r. The bonding layer 501 is, for example, the expanding tape used as described above in dicing the wafer 100 at a transport destination. The moisture absorbing layer 502 is provided on a surface of the bonding layer 501 opposite to the back surface 100r (that is, the objects 100A and 100B). The adsorption layer 503 is provided on a surface of the moisture absorbing layer 502 opposite to the bonding layer 501. The adsorption layer 503 adsorbs and holds minute pieces by adhesive force or electrostatic force, for example. Note that, the bonding layer 501 may have a configuration in which its entire surface has a bonding force (that is, bondable) or only a part of the surface has a bonding force (that is, bondable). For example, the bonding layer 501 may have a configuration in which a portion coming in contact with the back surface 100r is a bonding portion having a bonding force, and the wafer 100 is bonded and secured to the bonding layer 501 at the bonding portion.

An outer edge portion of the film 500 (here, the bonding layer 501) protrudes outward from the outer edges of the objects 100A and 100B when viewed in a direction intersecting (orthogonal to) the main surface 100s. A support body 510 is provided on the outer edge portion of the film 500 protruding from the object 100A. The support body 510 is a loop (or annular) shaped frame, for example, and is bonded to the bonding layer 501 in a downside of the film 500. The support body 510 can be commonly used, for example, in dicing the wafer 100 at a transport destination.

When transporting the objects 100A and 100B, the accommodating container P is used. The accommodating container P has a box shape, for example, and includes a space to accommodate a plurality (here, two) of the objects 100A and 100B. This space is formed so as to enable accommodation of the plurality of objects 100A and 100B to be arranged side by side while being separated from each other (avoiding contact with the main surface Ms in particular) in the thickness direction (direction from the main surface 100s toward the back surface 100r). An inner surface Ps of the accommodating container P includes a pair of protrusions Pa and a pair of protrusions Pb for one object 100A or 100B. The protrusions Pa corresponding to each other are formed at the same position in the vertical direction. The corresponding protrusions Pb are formed at the same position in the vertical direction at a position separated downward from the protrusion Pa. The pair of protrusions Pa and Pb arranged in the vertical direction constitute a clamping portion configured to vertically clamp the support body 510. In addition, each of the pair of protrusions Pa or Pb for one object 100A or 100B may be connected and integrated to each other (for example, in a shape such as an annular shape, a semicircular shape, or a U shape) in a plan view (for example, when viewed in a direction from the protrusion Pa to the protrusion Pb) or may be formed separately from each other.

In the transportation method according to the present embodiment, first, the objects 100A and 100B are accommodated in the accommodating container P (first step). In this step, the objects 100A and 100B are accommodated and supported in the accommodating container P in a state where the plurality of Fabry-Perot interference filters 1 is arranged two-dimensionally. Since the objects 100A and 100B are the wafers 100 as described above, here, the objects 100A and 100B are to be accommodated and supported in the accommodating container P as the wafer 100 in a state where the plurality of Fabry-Perot interference filters 1 is two-dimensionally arranged. That is, here, the objects 100A and 100B including the plurality of Fabry-Perot interference filters 1 in a state of being formed in a two-dimensional sheet shape (that is, a thin plate shape) that substantially would not deform will be accommodated in the accommodating container P. The objects 100A and 100B are accommodated and supported in the accommodating container P so as to avoid contact with the main surfaces 100s of the objects 100A and 100B (that is, the main surface Ms, the similar applies hereinafter). Here, the support body 510 is to be inserted between the protrusions Pa and the protrusions Pb in a state where the main surface 100s is directed downward so as to vertically clamp the support body 510 by the protrusions Pa and Pb, thereby supporting the objects 100A and 100B in the accommodating container P so as not to allow the entire objects 100A and 100B to come in contact with the inner surface Ps of the accommodating container P.

As described above, the films 500 are provided on the objects 100A and 100B. Therefore, in this step, the moisture absorbing layer 502 and the adsorption layer 503 are arranged in the accommodating container P with accommodating the objects 100A and 100B in the accommodating container P. In particular, in this step, the objects 100A and 100B are accommodated and supported in the accommodating container P such that the adsorption layer 503 of one object 100B faces the main surface 100s of another object 100A in a downside of the main surface 100s of the other object 100A.

Subsequently, the entire accommodating container P is to be accommodated in a vacuum pack, and the inside of the accommodating container P is to be evacuated by exhausting the vacuum pack (second step). Thereafter, the accommodating container P and the objects 100A and 100B in the accommodating container P are transported in a state of being held in the vacuum pack, to a desired location. This makes it possible to transport the plurality of Fabry-Perot interference filters 1 collectively.

As described above, in the transportation method according to the present embodiment, the transport objects 100A and 100B include the plurality of Fabry-Perot interference filters 1 (the Fabry-Perot interference filter portions 1A). In addition, in the first step, the two-dimensionally arranged Fabry-Perot interference filters 1 is accommodated and supported in the accommodating container P. In this manner, in a state where the plurality of Fabry-Perot interference filters 1 is arranged two-dimensionally, it is easier to perform collective accommodation (insert and arrange) and support in the accommodating container P while avoiding occurrence of contact with mirror portions such as the first mirror portion 31 and the second mirror portion 32 (main surface Ms on the membrane structure M), compared with a case where the Fabry-Perot interference filters 1 are handled individually. Therefore, this method makes it possible to transport a plurality of (a large number of) Fabry-Perot interference filters 1 with a simple configuration with reduced risk of breakage.

The membrane structure M has a configuration that is relatively easily broken among components of the Fabry-Perot interference filter 1. Therefore, forming the membrane structure M at an early stage (stage of the wafer 100) might increase the risk of breakage. For example, in a case where the membrane structure M is formed at the stage of the wafer 100 and where water is used in the subsequent cutting step, the membrane-like second mirror portion 32 floating on the gap S might be broken by water pressure or entrance of water into the gap S might cause sticking (a phenomenon in which the second mirror portion 32 comes into contact with the first mirror portion 31 and stops movement).

Furthermore, there is a possibility, in the wafer 100 on which the membrane structures M are arranged, that a large number of the Fabry-Perot interference filters 1 might become faulty at one time due to arrival of foreign substance or the like. Furthermore, there is a concern that the shaking or vibration during transport might influence the membrane structure M. Therefore, in order to adopt transportation in the state of the wafer 100 including the membrane structure M in transporting a large number of Fabry-Perot interference filters 1 without using individual containers, there is a need to consider ways to reduce the risk of breakage. In contrast, with the transportation method according to the present embodiment, it would be possible, as described above, to achieve collective transportation of a large number of Fabry- Perot interference filters 1 with reduced risk of breakage by handling the large number of two-dimensionally arranged Fabry-Perot interference filters 1 and performing accommodation and support in the accommodating container P. As described above, by adopting, in the present embodiment, a method of cutting the wafer 100 by forming a modified region inside the substrate layer 110 along each of the lines 5 using irradiation of laser light, it is possible to solve the above-described problem caused by use of water.

In the transportation method according to the present embodiment, the objects 100A and 100B are the wafers 100 in which the plurality of Fabry-Perot interference filters 1 is formed. The wafer 100 includes: the main surface 100s (first surface) on the side of the first mirror portion 31 and the second mirror portion 32 with respect to the substrate 11 (substrate layer 110); and the back surface (second surface) 100r opposite to the main surface 100s. In addition, in the first step, the objects 100A and 100B are accommodated and supported in the accommodating container P in a state where the plurality of Fabry-Perot interference filters 1 is arranged two-dimensionally as the wafer 100. In this case, the plurality of Fabry-Perot interference filters 1 are integrated as the wafer 100. For this reason, it is possible to transport a large number of (a plurality of) Fabry-Perot interference filters 1 with a simpler configuration with reduced risk of breakage.

In the transportation method according to the present embodiment, the bonding layer 501 is provided on the back surface 100r of the wafer 100 opposite to the main surface 100s. The support body 510 is provided at the outer edge portion of the bonding layer 501, and the protrusions (clamping portions) Pa and Pb that vertically clamp the support body 510 are provided on the inner surface Ps of the accommodating container P. In the first step, the objects 100A and 100B are supported in the accommodating container P by clamping the support body 510 by using the protrusions Pa and Pb. In this case, the plurality of Fabry-Perot interference filters 1 is integrated as the wafer 100. This prevents breakage of the Fabry-Perot interference filter 1 due to contact with the clamping portion when the objects 100A and 100B are accommodated and supported.

In the transportation method according to the present embodiment, in the first step, the objects 100A and 100B are supported in the accommodating container P by clamping the support body 510 by using the protrusions Pa and Pb in a state where the main surface 100s faces downward. For this reason, the mirror portion (the main surface Ms of the membrane structure M) is set to face downward in the accommodating container P. For this reason, even when the mirror portion (membrane structure M) is broken in one Fabry-Perot interference filter 1, fragments of the broken portion are unlikely to influence the other Fabry-Perot interference filters 1.

In the transportation method according to the present embodiment, the moisture absorbing layer 502 is provided on a surface of the bonding layer 501 opposite to the main surface 100s, and the adsorption layer 503 is provided on a surface of the moisture absorbing layer 502 opposite to the bonding layer 501. Additionally, in the first step, the objects 100A and 100B are accommodated and supported in the accommodating container P such that the adsorption layer 503 of one object 100B faces the main surface 100s of another object 100A in a downside of the main surface 100s of the other object 100A. In this case, it is possible to dispose the moisture absorbing layer 502 and the adsorption layer 503 in the accommodating container P together with accommodating the objects 100A and 100B into the accommodating container P. In particular, in this case, it is possible to dispose the moisture absorbing layer 502 at a position closer to the Fabry-Perot interference filter 1 as compared with a case where a moisture absorbing member is disposed at a bottom of the accommodating container P, for example. Furthermore, the adsorption layer 503 is disposed below the main surface Ms of the membrane structure M so as to face the main surface Ms. Therefore, even in a case where the membrane structure M is broken in one Fabry-Perot interference filter 1, the fragments of the broken portion would be adsorbed by the adsorption layer 503 in the accommodating container P (for example, the adsorption layer 503 on the back surface 100r of the object adjacent to the object including the Fabry-Perot interference filter 1 having the breakage). Therefore, it is possible to prevent transmission of the influence of the breakage to other Fabry-Perot interference filters 1.

The transportation method according to the present embodiment includes, after the first step, the second step of accommodating the accommodating container P in a vacuum pack and evacuating the inside of the accommodating container P by exhausting the vacuum pack. In this case, it is possible to evacuate the inside of the accommodating container P without influencing the Fabry-Perot interference filter 1.

The above embodiment has described one embodiment of the transportation method according to one aspect of the present invention. Therefore, the transportation method according to one aspect of the present invention is not limited to the above-described method, and may include an arbitrary modification of the above-described method. Subsequently, a modification of the transportation method will be described. In the wafer 100, when viewed in the thickness direction of the substrate layer 110, the outer shape of the Fabry-Perot interference filter portion 1A and the outer shape of the dummy filter portion 2A need not be the same. Furthermore, when cutting out a plurality of Fabry-Perot interference filters 1 from the wafer 100, there is no need to cut out all the dummy filter portions 2A (that is, it is not necessary to singulate all the dummy filter portions 2A). Furthermore, the configuration of the dummy area 102 is not limited to the above. For example, in a region corresponding to the dummy area 102, at least the second mirror portion 32 need not be surrounded by the first groove 290 that is annularly continuous (for example, the first groove 290 may simply cross a region corresponding to the dummy area 102), or the first groove 290 need not be formed in the device layer 200. Furthermore, in a region corresponding to the dummy area 102, a portion of the device layer 200 or the entire device layer 200 need not be provided. That is, in the wafer being a transportation object, the dummy area is not an essential configuration.

Figure 9:
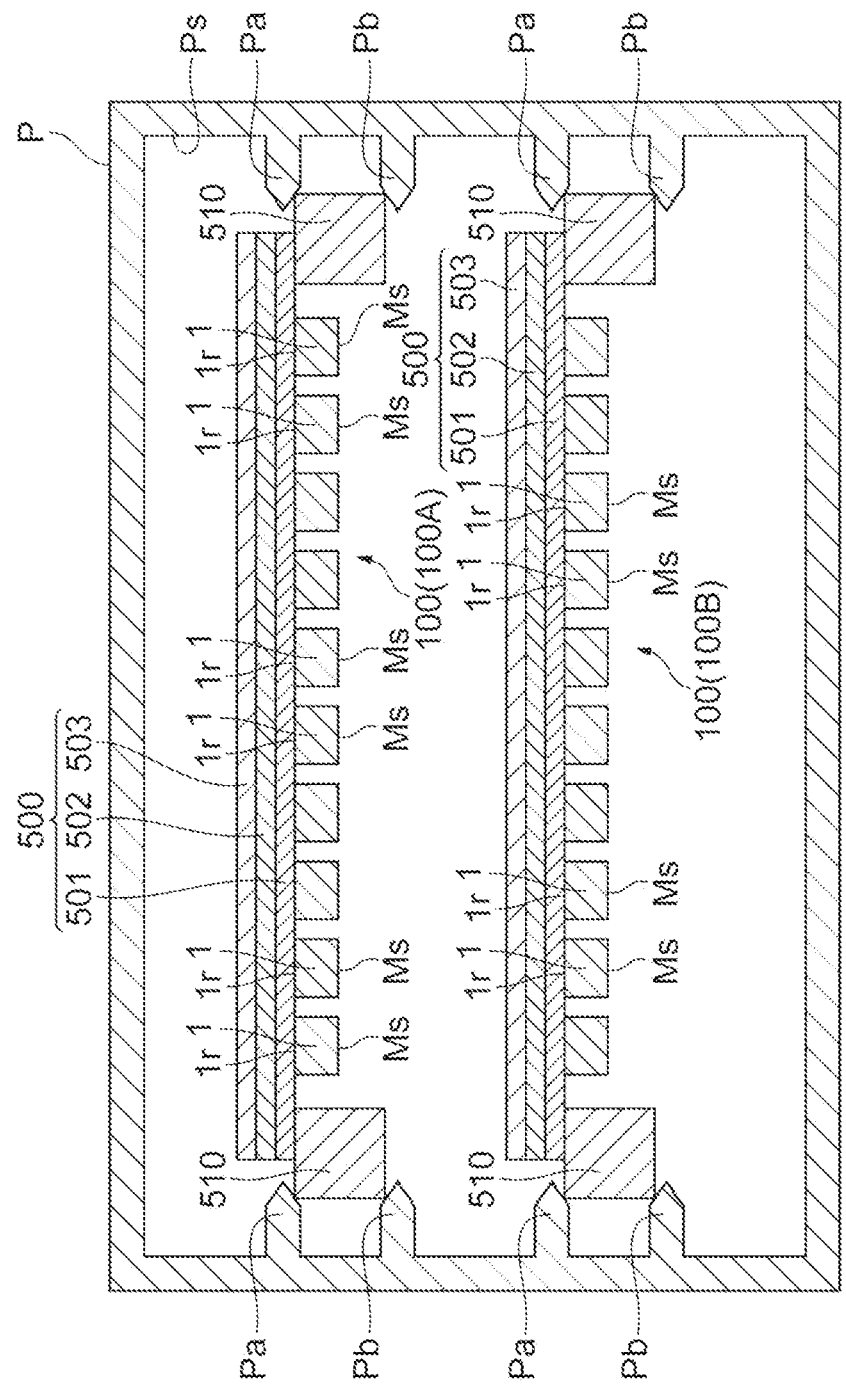
FIG. 9 is a schematic cross-sectional view illustrating an example of a transportation method according to a modification.

FIG. 9 is a schematic cross-sectional view illustrating an example of a transportation method according to a modification. As illustrated in FIG. 9, each of the objects 100A and 100B here includes: the bonding layer 501; and a plurality of Fabry-Perot interference filters 1 formed separately from each other, two-dimensionally arranged, and bonded to the bonding layer 501. The plurality of Fabry-Perot interference filters 1 may be fixed in a state where the Fabry-Perot interference filters 1 are separated from each other in order to avoid an occurrence of breakage due to contact with each other. In this case, the two-dimensional array is not limited to a periodic array (for example, a two-dimensional lattice array) and may be an array that is randomly distributed in a predetermined plane. In addition, the main surfaces Ms of the membrane structure M of each of the Fabry-Perot interference filters 1 (the first surface on the side of the first mirror portion 31 and the second mirror portion 32 with respect to the substrate 11 of the Fabry-Perot interference filter 1, and the second surface opposite to the first surface) are be located on a same plane. Such objects 100A and 100B may be obtained, for example, by a procedure including manufacturing the Fabry-Perot interference filters 1 by dicing the wafer 100 as described above, picking up the manufactured Fabry-Perot interference filters 1 and then bonding the Fabry-Perot interference filters 1 to the bonding layer 501. That is, the sheet-like objects 100A and 100B including the plurality of Fabry-Perot interference filters 1 are formed. The objects 100A and 100B in this state has a sheet shape deformable in accordance with flexibility of the bonding layer 501. Thereafter, the plurality of Fabry-Perot interference filters 1 is two-dimensionally arranged by the outer edge portion of the bonding layer 501 being supported by the support body 510, so as to be in a fixed state of suppressing the change in a mutual positional relationship (sheet shape that would not substantially deform). Here, the objects 100A and 100B do not include the dummy filter 2. Even in this case, it is possible, in the first step, to allow the protrusions Pa and Pb to clamp the support body 510 in a state where the main surface Ms (the above-described first surface) of the membrane structure M of each of the Fabry-Perot interference filters 1 faces downward, and possible to store (insert and arrange) and support the sheet-like objects 100A and 100B in the accommodating container P as described above.

Even in this case, a plurality of Fabry-Perot interference filters 1 formed separately from each other is arranged in a two-dimensional sheet shape and bonded (secured) to the bonding layer 501. This makes it easier to carry out accommodation and support 1 so as not to come in contact with the mirror portion (main surface Ms (first surface) of the membrane structure M). Furthermore, in this case, eliminating the Fabry-Perot interference filter 1 determined to be faulty in a preliminary inspection at the time of pickup of the Fabry-Perot interference filter 1 after manufacturing the Fabry-Perot interference filter 1 by dicing the wafer 100 would make it possible to determine non-faulty product alone to be an object of transportation without including faulty products. Furthermore, the first surface is set to face downward in the accommodating container P. For this reason, even when the mirror portion (membrane structure M) is broken in one Fabry-Perot interference filter 1, fragments of the broken portion are unlikely to influence other Fabry-Perot interference filters 1. Moreover, even when the mirror portion (membrane structure M) is broken in one Fabry-Perot interference filter 1, fragments of the broken portion will be adsorbed onto the adsorption layer 503, making is possible to prevent the situation in which the broken fragments influence other Fabry-Perot interference filters 1.

Although the above-described example is a case of a mode in which the objects 100A and 100B are supported in the accommodating container P via the film 500 and the support body 510, there is no need to use the film 500 and the support body 510. That is, it is allowable to use a configuration in which a clamping portion configured to vertically clamp an object being the wafer 100 in the dummy area 102 is provided on the inner surface Ps of the accommodating container P, and in the first step, the object may be supported in the accommodating container P by clamping the dummy area 102 with the clamping portion in a state where the main surface 100s facing downward. In this case, it is possible to support the object in the accommodating container P without separately using a member such as the support body 510. Furthermore, since the dummy area 102 is provided at the outer edge portion of the wafer 100 being the object, the strength of the wafer 100 is improved and the warpage is suppressed. For this reason, the object can be accommodated easily in the accommodating container P.

Figure 10:
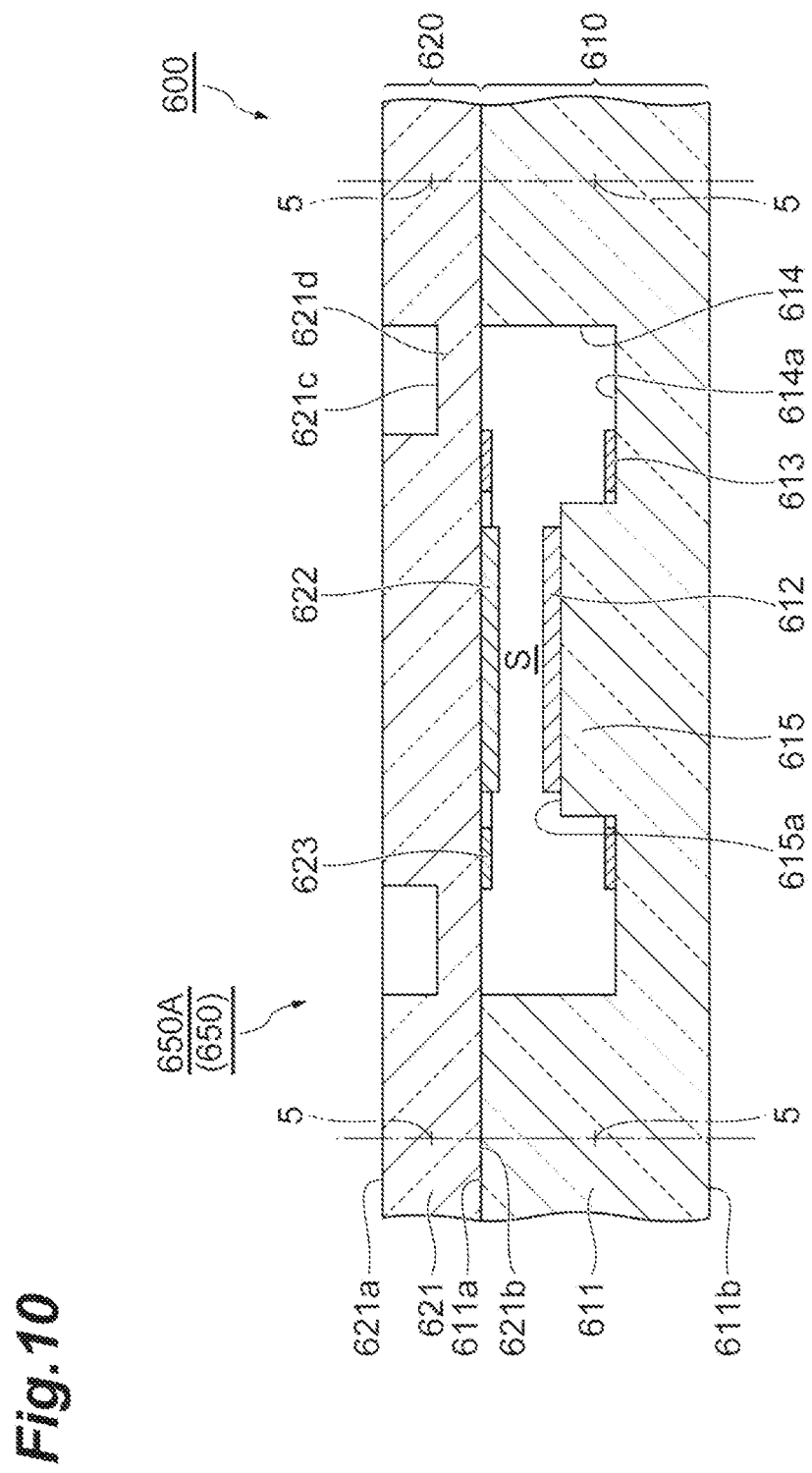
FIG. 10 is a cross-sectional view of a wafer according to a modification.

Furthermore, as illustrated in FIG. 10, it is allowable to define a wafer 600 formed by joining a first wafer 610 and a second wafer 620 to have a substantially non-deformable sheet shape (that is, a plate shape), as the transportation object. The wafer 600 includes a plurality of Fabry-Perot interference filter portions 650A. The plurality of Fabry-Perot interference filter portions 650A is to be a plurality of Fabry-Perot interference filters 650 when the wafer 600 is cut along each of lines 5 set on each of the first wafer 610 and the second wafer 620. The plurality of Fabry-Perot interference filter portions 650A is two-dimensionally arranged when viewed in the thickness direction of the wafer 600.

The first wafer 610 includes a substrate layer 611, a plurality of first mirror portions 612, and a plurality of drive electrodes 613. The substrate layer 611 includes a surface 611a and a surface 611b opposite to the surface 611a. The substrate layer 611 is formed of a light transmitting material. Each of the first mirror portions 612 is a metal film, a dielectric multilayer film, or a composite film thereof, for example. The drive electrode 613 is formed of a metal material, for example.

The second wafer 620 includes a substrate layer 621, a plurality of second mirror portions 622, and a plurality of drive electrodes 623. The substrate layer 621 includes a surface 621a and a surface 621b opposite to the surface 621a. The substrate layer 621 is formed of a light transmitting material. Each of the second mirror portions 622 is a metal film, a dielectric multilayer film, or a composite film thereof, for example. The drive electrode 623 is formed of a metal material, for example.

In the wafer 600, one Fabry-Perot interference filter portion 650A includes one first mirror portion 612, one drive electrode 613, one second mirror portion 622, and one drive electrode 623. Hereinafter, the configuration of the wafer 600 will be described focusing on the one Fabry-Perot interference filter portion 650A.

A recess 614 is formed on the surface 611a of the substrate layer 611. A protrusion 615 is provided on a bottom surface 614a of the recess 614. The height of the protrusion 615 is less than the depth of the recess 614. That is, an end surface 615a of the protrusion 615 is at a recessed level with respect to the surface 611a of the substrate layer 611. The first mirror portion 612 is provided on the end surface 615a of the protrusion 615. The drive electrode 613 is provided on the bottom surface 614a of the recess 614 so as to surround the protrusion 615. The drive electrode 613 is electrically connected to an electrode pad (not illustrated) via wiring (not illustrated) provided on the substrate layer 611, for example. The electrode pad is provided in a region of the substrate layer 611 that can be accessed from the outside, for example.

The surface 621b of the substrate layer 621 is joined to the surface 611a of the substrate layer 611 by a plasma polymerized film or the like, for example. On the surface 621b of the substrate layer 621, the second mirror portion 622 and the drive electrode 623 are provided. The second mirror portion 622 faces the first mirror portion 612 via the gap S. The drive electrode 623 is provided on the surface 621b of the substrate layer 621 so as to surround the second mirror portion 622 and faces the drive electrode 613 via the gap S.

The drive electrode 623 is electrically connected to an electrode pad (not illustrated), for example, via wiring (not illustrated) provided on the substrate layer 621. The electrode pad is provided in a region of the substrate layer 621 that can be accessed from the outside, for example.

A groove 621c is formed on the surface 621a of the substrate layer 621 so as to surround the second mirror portion 622 and the drive electrode 623 when viewed in the thickness direction of the wafer 600. The groove 621c extends in an annular shape. The portion of the substrate layer 621 surrounded by the groove 621c is displaceable in the thickness direction of the wafer 600 with the portion where the groove 621c is formed defined as a diaphragm-like holder 621d. In the diaphragm-like holder 621d, it is allowable to form a groove surrounding the second mirror portion 622 and the drive electrode 623 when viewed in the thickness direction of the wafer 600 on at least one of the surface 621a and the surface 621b of the substrate layer 621. Furthermore, it is also allowable to form the groove surrounding the first mirror portion 612 and the drive electrode 613 in the substrate layer 611 when viewed in the thickness direction of the wafer 600 so as to form the diaphragm-like holder in the substrate layer 611. Further alternatively, instead of the diaphragm-like holder, a holder may be formed by a plurality of beams arranged radially.

In the wafer 600 on which each of the Fabry-Perot interference filter portions 650A is formed as described above, when a voltage is applied between the drive electrode 613 and the drive electrode 623 in each of the Fabry-Perot interference filter portions 650A, an electrostatic force corresponding to the voltage is generated between the drive electrode 613 and the drive electrode 623. The portion of the substrate layer 621 surrounded by the groove 621c is attracted toward the substrate layer 611 side by the electrostatic force, thereby adjusting the distance between the first mirror portion 612 and the second mirror portion 622. This allows transmission of light having a wavelength corresponding to the distance between the first mirror portion 612 and the second mirror portion 622.

The wafer 600 as a transportation object includes a plurality of two-dimensionally arranged Fabry-Perot interference filters 650. The Fabry-Perot interference filter 650 includes: the substrate formed from the substrate layer 611; and the first mirror portion 612 and the second mirror portion 622 provided on the substrate to face each other via the gap S and in which the distance from each other is variable. Furthermore, in the wafer 600 and the Fabry-Perot interference filter 650, the first surface on the side of the first mirror portion 31 and the second mirror portion 32 with respect to the substrate layer 611 (and the substrate formed from the substrate layer 611) corresponds to the surface 621a of the substrate layer 621 (and the substrate formed from the substrate layer 621), with the substrate layer 611 as reference. Furthermore, the second surface opposite to the first surface is the surface 611b of the substrate layer 611 (and the substrate formed from the substrate layer 611).

Even in a case where such a wafer 600 is transported as an object, the object will be accommodated in the accommodating container P in the first step similarly to the above-described case. At this time, in the first step, the object is accommodated and supported in the accommodating container P in a state where the plurality of Fabry-Perot interference filters 650 is arranged two-dimensionally.

INDUSTRIAL APPLICABILITY

It is possible to provide a transportation method capable of transporting a large number of Fabry-Perot interference filters with reduced risk of breakage.

REFERENCE SIGNS LIST 1, 650 Fabry-Perot interference filter
2 Dummy filter
11 Substrate
31 First mirror portion
32 Second mirror portion
100, 600 Wafer
100A, 100B Object
101 Effective area
102 Dummy area
501 Bonding layer
502 Moisture absorbing layer
503 Adsorption layer
P Accommodating container
Ps Inner surface
Pa, Pb Protrusion (clamping portion)

The invention claimed is:

1. A transportation method for transporting an object including a plurality of Fabry-Perot interference filters, the transportation method comprising a first step of accommodating the object in an accommodating container,
wherein each of the plurality of the Fabry-Perot interference filters includes a substrate, a first mirror portion and a second mirror portion provided on the substrate to face each other via a gap and in which a distance from each other is variable,
in the first step, the object is accommodated and supported in the accommodating container on a support body supported by at least one protrusion of the accommodating container in a state where the plurality of Fabry-Perot interference filters are two-dimensionally arranged and each of the Fabry-Perot interference filters is separated from a bottom surface of the accommodating container, and
a plurality of objects are stacked within the accommodating container.

2. The transportation method according to claim 1,
wherein the object is a wafer in which the plurality of Fabry-Perot interference filters are formed,
the wafer includes a first surface on sides of the first mirror portion and the second mirror portion with respect to the substrate and includes a second surface opposite to the first surface, and
in the first step, the object is accommodated and supported in the accommodating container in the state where the plurality of Fabry-Perot interference filters are two-dimensionally arranged as the wafer.

3. The transportation method according to claim 2,
wherein the object includes a bonding layer bonded to the second surface,
the support body is provided at an outer edge portion of the bonding layer, and
in the first step, the object is supported in the accommodating container by supporting the support body.

4. The transportation method according to claim 3,
wherein in the first step, the object is supported by vertically supported the support body in the state where the first surface faces downward.

5. The transportation method according to claim 2,
wherein an effective area including the plurality of Fabry-Perot interference filters and an outer edge surrounding the effective area are formed in the wafer,
in the first step, the object is supported in the accommodating container by supporting the outer edge.

6. The transportation method according to claim 5,
wherein in the first step, the object is supported in the accommodating container by vertically supporting the outer edge in the state where the first surface faces downward.

7. The transportation method according to claim 1,
wherein the object includes a bonding layer and the plurality of Fabry-Perot interference filters separately formed from each other, the Fabry-Perot interference filters are two-dimensionally arranged and are bonded to the bonding layer,
the support body is provided on an outer edge portion of the bonding layer,
the Fabry-Perot interference filter includes a first surface on the sides of the first mirror portion and the second mirror portion with respect to the substrate and includes a second surface that is a surface opposite to the first surface and that is bonded to the bonding layer, and
in the first step, the object is supported in the accommodating container by supporting the support body in the state where the first surface faces downward.

8. The transportation method according to claim 3,
wherein a moisture absorbing layer is provided on a surface of the bonding layer opposite to the second surface,
an adsorption layer is provided on a surface of the moisture absorbing layer opposite to the bonding layer, and
in the first step, the object is accommodated and supported in the accommodating container such that the adsorption layer of one object faces the first surface of another object in a downside of the first surface of another object.

9. The transportation method according to claim 1, further comprising,
after the first step, a second step of accommodating the accommodating container into a vacuum pack and evacuating an inside of the accommodating container by exhausting the vacuum pack.

* * * * *